US006643417B2

(12) United States Patent
Strutz et al.

(10) Patent No.: US 6,643,417 B2
(45) Date of Patent: Nov. 4, 2003

(54) ALL OPTICAL IMAGE REJECT DOWN-CONVERTER

(75) Inventors: Shane J. Strutz, Columbia, MD (US); Keith J. Williams, Dunkirk, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 66 days.

(21) Appl. No.: 09/810,653

(22) Filed: Mar. 16, 2001

(65) Prior Publication Data

US 2002/0131662 A1 Sep. 19, 2002

(51) Int. Cl.[7] .................................................. G02F 2/00
(52) U.S. Cl. ........................................... 385/1; 359/326
(58) Field of Search ............................. 385/1–3, 41–42; 359/183, 326

(56) References Cited

U.S. PATENT DOCUMENTS 4,933,929 A * 6/1990 Tajima ........................ 359/133
5,917,628 A * 6/1999 Ooi et al. .................... 359/135
5,995,685 A * 11/1999 Seino ............................. 385/3
6,426,821 B1 * 7/2002 Price et al. .................. 359/156

OTHER PUBLICATIONS

Strutz, Williams, An 8–18GHz All Optical Microwave Downconverter With Channelization, IEEE Transactions, vol. 49, No. 10, Oct. 2001, 1992–1995.
Kamitsuna, Ogawa, Monolithic Image Rejection Optoelectronic Up Converters that Employ the MMIC Process, IEEE Transactions, vol. 41, No. 12, Dec. 1993, 2323–2329.
Johnson, Cox, III, Serrodyne Optical Frequency Translation with High Sideband Suppression, Journal of Lightwave Technology, vol. 6, No. 1, Jan. 1988, 109–112.
Chao, Wenyue, Shiang, Photonic Mixers and Image Rejection Mixers for Optical SCM Systems, IEEE Transactions, vol. 45, No. 8, Aug. 1997, 1478–1480.
Strutz et al, All Optical Image Reject Down Converter, Patent Application No. 09/635,985, filed Aug. 9, 2000.
Ward et al, Image Rejection Microwave Photonic Downconverter, Patent Application No. 09/620,324, filed Jul. 17,2000.

* cited by examiner

Primary Examiner—Robert H. Kim
Assistant Examiner—Krystyna Suchecki
(74) Attorney, Agent, or Firm—Lawrence G. Legg; John J. Karasek

(57) ABSTRACT

An optical image reject down-converter for mapping a received radio frequency (RF) into an arbitrary intermediate frequency range and for precluding interference between the received signals. A received radio frequency signal is down-converted into an intermediate frequency band for use by an electronic circuit in other devices. Optical light is divided into a first path and a second path. Light in the first path is transferred into an optical sideband by a first optical modulator or phase modulator. Light in a second path is converted into sidebands by a second, non-cascaded optical modulator and then passed through a tunable narrow-band optical filter which selects the desired sideband. The optical spectrum of the second path then primarily includes light at the frequency equal to the original laser frequency plus the additional sidebands. The filtered sideband is heterodyned with the light from the first path, resulting in a down-conversion to the desired intermediate frequency. Image frequencies initially present in the optical link are thereby filtered and rejected.

28 Claims, 5 Drawing Sheets

ALL OPTICAL IMAGE REJECT DOWN-CONVERTER

FIELD OF THE INVENTION

This invention relates to an optical down-converter for the mapping of received radio frequencies into an arbitrary intermediate frequency range while precluding interference between the received signals. More particularly, the invention relates to a device for improving image rejection to improve the harmonic spurs limiting system performance.

BACKGROUND OF THE INVENTION

Prior art image rejection systems providing significant frequency translation include those that use a digital phase modulator to produce a serrodyne phase modulated waveform, and those that split a received signal into two parts and then recombine them in such a way as to eliminate the unwanted image and carrier frequencies. Optical image rejection mixers that utilize the serrodyne method of frequency translation apply a sawtooth waveform to phase modulate the optical signal, thereby causing the optical frequency to shift. The achievable image rejection is limited by the number of discrete bits that can be implemented by the digital phase modulator when approximating the sawtooth waveform. This limits the image rejection to approximately 25 dB.

In the case of microwave image rejection mixers, the achievable image rejection is limited by the need for near perfect amplitude and phase control. As shown in FIG. 1, a received radio frequency (RF) signal 124 is first divided into two signals 116 and 118 in a in-phase power divider 122, mixed in associated mixers 112 and 114 with a local oscillator input 102 (LO IN) and split into associated signals 106 and 108 that are shifted 90° in a first 3 dB 90° hybrid power divider 123. The output of the mixers 112 and 114 are then recombined with a 90° phase shift between the two components in a second 3 dB 90° hybrid power divider 126 and output as an intermediate frequency band 134. Exact amplitude and phase matching with broad band signals is nearly impossible with strictly microwave components since the frequency response of each component varies. A typical device, with a 3° phase error and a 0.25 dB amplitude imbalance upon recombination, is limited to about 36 dB of image and carrier rejection. Further details on serrodyne frequency shifting can be found in Johnson et al., SERRODYNE OPTICAL FREQUENCY TRANSLATION WITH HIGH SIDEBAND SUPPRESSION, J. of Lightwave Tech., Vol. 6, No. 6, pg. 109, 1988.

Another optical image rejection down-converter described in U.S. patent application Ser. No. 09/620,324 by Ward et al., entitled IMAGE REJECTING MICROWAVE PHOTONIC DOWNCONVERTER, Navy Case No. 79,800, filed Jul. 17, 2000, employs an electronic mixer for up-converting signals into the passband of a bandpass filter followed by optical down-converting of the filtered signals into a desired output band, as shown in FIG. 2, thereby providing greater than 60 dB of image rejection. The device allows telecommunications systems to down-convert the lower sideband of densely multiplexed ultra-wideband bandwidth channels into low frequency bands where conventional electronics can perform signal processing function; has the image rejection (>60 dB) to provide unambiguous signals for direction finding applications; and exhibits efficient image rejection that should permit multi-octave microwave frequency reception and compression. In addition, that invention is intrinsically remoteable, due to the various optical and electrical components that may be used to construct the subject device. The device, however, utilizes a first local oscillator at frequencies below the original frequency of a bandpass filter that may allow harmonics from the local oscillator to convert undesired input radio frequency (RF) frequencies into spurious signals presenting the output intermediate frequency band being applied to user electronics. These harmonics can be handled by the user electronics but additional signal processing would be required.

A recently developed all-optical image rejection system down-converter capable of removing the harmonics before entering the user electronics is described in U.S. patent application Ser. No. 09/635,985 by Strutz et al., entitled ALL OPTICAL IMAGE REJECT DOWN CONVERTER, Navy Case No. 82,339, filed Aug. 9, 2000. The device, which by eliminating the microwave mixers of the non-all optical prior art systems provides advantages over the prior art devices, is shown in FIG. 3. Light from a fiber coupled laser, e.g. at a wavelength of approximately 1550 nm, is amplified and then divided into two paths by a polarization maintaining coupler. In one path, light is amplitude modulated by optical modulator MZM1 driven by a local oscillator LO1. The amplitude modulation causes light to be shifted from the fundamental beam into the RF sidebands. The second path includes two cascaded optical modulators, MZM2 and MZM3, where MZM2 modulates the light at a first frequency, e.g. 18 Ghz, after which the light is amplified by an erbium doped fiber amplifier and then modulated a second time by MZM3 driven by RF In, producing wavelengths at an input fundamental frequency, e.g. 1550 nm, a first modulated fundamental frequency, e.g. ±18 Ghz, a fundamental ±RF In, and a second modulated fundamental frequency, e.g. ±18 Ghz±RF In. The light is amplified again before passing through a filter that selects one of the optical sidebands; optionally, the amplified light may be passed through multiple optical filters (not shown). Upon recombining the two paths, the beat signal produced by heterodyning the light at the filtered signal with the sideband produced by LO1 is detected and an intermediate frequency (IF) output is applied to an optical transmission line and then sent to user electronics (not shown). Although the system is advantageous for remote applications since it is composed of two fiber optic links, there may exist some inherent conversion loss ("CL"), e.g. on the order of up to about 60 dB, that may be undesirable in some applications. A preamplifier may then be necessitated to compensate for the CL, increasing the system's cost and complexity, and the system might also exhibit a limited spur free dynamic range.

SUMMARY OF THE INVENTION

The object of this invention is to is to provide an apparatus for the improvement of image rejection in image rejection mixing systems while removing harmonic spurs.

Another object of this invention is to provide a device having sufficiently large image rejection capability so as to allow precise determination of frequency for direction finding applications.

These and other objectives are accomplished by the all-optical image reject down converter which maps received radio frequency (RF) into an arbitrary intermediate frequency (IF) range, while precluding interference between the received signals. The invention converts a received radio frequency signal into an arbitrary intermediate frequency for use by an electronic circuit in other devices. An example of the system's ability to convert a received 9 GHz signal into a 2 GHz intermediate frequency is as follows. Optical light originating from a laser is divided into two paths. Light in a first path is transferred into an optical sideband by a first optical modulator or phase modulator (LO1=7 GHz). Light in a second path is converted into 9 GHz sidebands by a second, single (i.e., non-cascaded) optical modulator, generating light with an optical spectrum that includes many wavelengths. The light from the second optical modulator is then passed through a narrow, tunable optical filter that selects the 9 Ghz sideband, thereby producing an optical spectrum that primarily includes light at a frequency equal to the initial input laser frequency plus the 9 GHz signal. The filtered second path sideband is then heterodyned with the light from the first path, resulting in a down-conversion to 2 Ghz.

The use of a narrow-band optical filter allows the system to select a particular sideband for use in the heterodyne down-conversion. As a result, image frequencies present at the RF input are filtered out and are rejected. The image rejection of the system is a function of filter extinction.

The down-convertor allows telecommunications systems to down-convert densely multiplexed ultra-wide bandwidth channels into low frequency bands where conventional electronics can perform signal processing functions. It provides image reduction to provide unambiguous signals for applications such as direction finding. It exhibits a bandwidth sufficient for permitting multi-octave microwave frequency reception and compression. It has at least an order of magnitude reduction in conversion loss compared to other down-converters. The all optical down-converter is intrinsically remotable and therefore suitable for use in numerous fiber optic and antenna systems.

DESCRIPTION OF THE PREFERRED EMBODIMENTS

Figure 4:
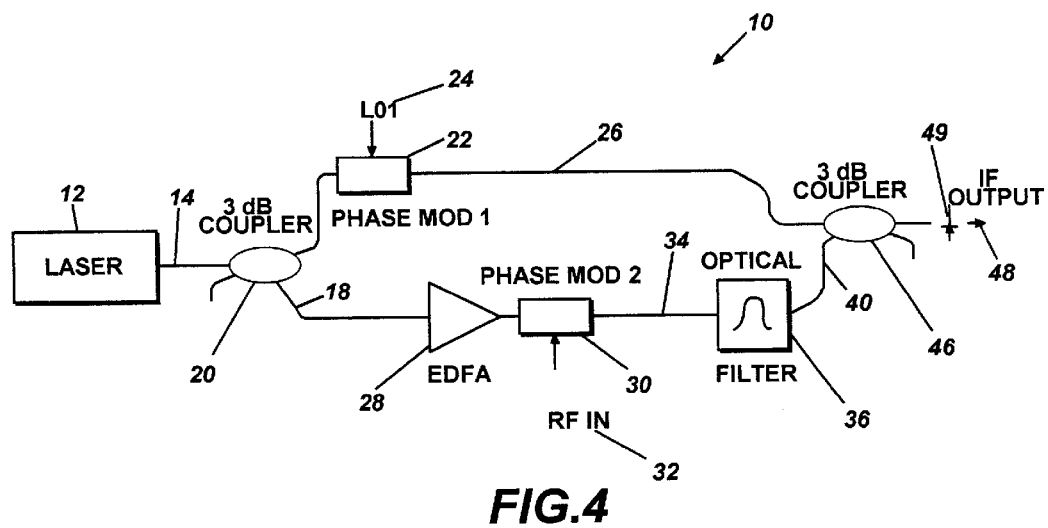
FIG. 4 shows a schematic diagram of a single channel optical image reject down converter according to the invention.
Figure 5A:
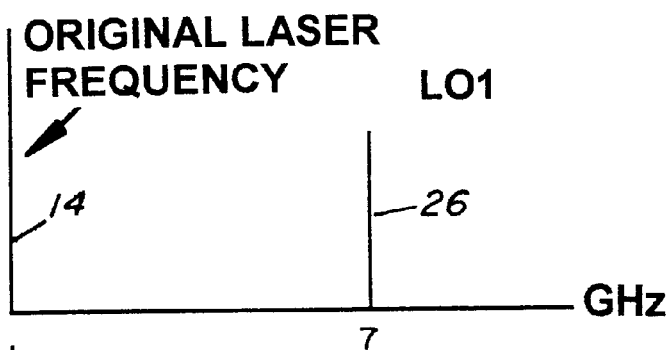
FIG. 5a shows a schematic of light originating from a laser transferred into an optical sideband by a Mach-Zehnder modulator.
Figure 5B:
FIG. 5b shows a light signal that, after being amplified and modulated with additional sidebands generated by a received 9 GHz signal, has then been filtered to select the 9 Ghz sideband.
Figure 5C:
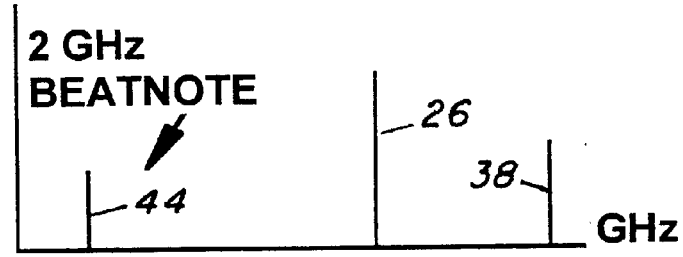
FIG. 5c shows a filtered sideband heterodyned with a 7 GHz signal resulting in down-conversion to 2 Ghz.
Figure 5D:
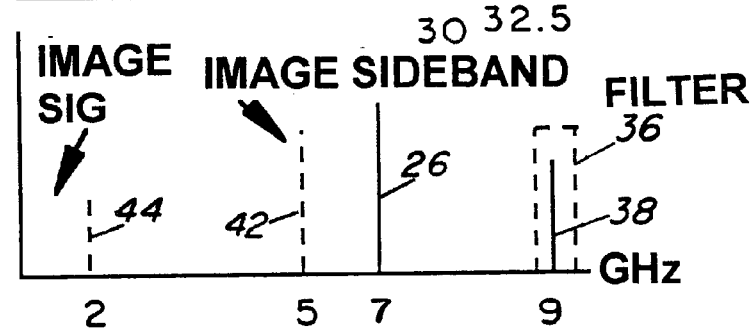
FIG. 5d shows a radio frequency (RF) input at 5 GHz mixed with a 7 GHz sideband from a local oscillator to produce a 2 GHz sideband which is rejected by the optical filter.

Referring now to FIGS. 4 through 5d, a single channel down-converter 10 includes a fiber-coupled laser light source 12 producing an optical light signal 14 at an initial frequency, e.g. about 1550 nm. The light source 12 may be of any type that can be used to down-convert radio frequency (RF) frequencies through optical heterodyning. Light signal 14 is divided into a first path 16 and a second path 18 by a first 3 dB polarization maintaining (PM) optical coupler 20. In first path 16, light signal 14 is modulated by a first phase modulator 22 driven with a first local oscillator (LO1) 24 operating at a frequency of approximately 2–26 Ghz. Virtually, any frequency band may be chosen so long as the proper combinations of oscillator 24 and RF frequencies input into a second path modulator 30 (described below) are used. The modulation causes light to be shifted from the initial light signal 14 frequency into an RF sideband 26 (LO1=7 Ghz) as shown in FIG. 5a.

In second path 18, input laser light signal 14 is amplified by an amplifier 28 and then phase modulated by a second phase modulator 30 driven with an applied RF signal 32, generating a light signal 34 having an optical spectrum that includes 9 Ghz sidebands and many optical wavelengths. Next, light signal 34 is passed through a narrow-band tunable optical filter 36 that is tuned to select a 9 GHz sideband 38 as shown in FIG. 5b, producing a light signal 40 ideally having an optical spectrum at a frequency of the initial laser light signal 14 frequency plus 9 GHz sideband 38. Optionally, instead of a single optical filter 34, multiple optical filters may be used. Light signal 40 is then combined in coupler 46 with 7 GHz signal 26 from first path 16, resulting in down-conversion to a 2 GHz signal 48 when signals 40 and 26 are mixed in a photodector 49, e.g. a photodiode. Intermediate frequency output signal 48 is then applied to an optical transmission line for application to user electronics (not shown) at a remote location.

Figure 1:
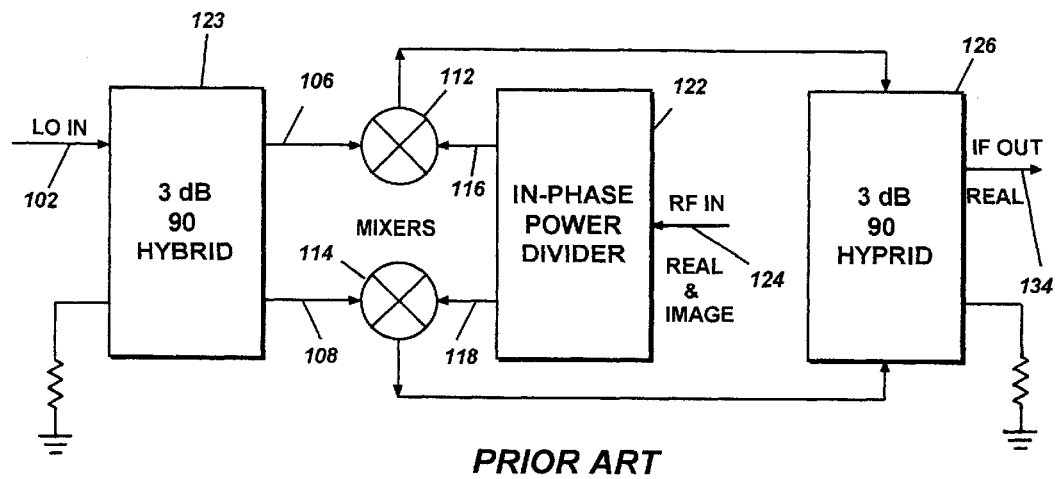
FIG. 1 shows a schematic diagram of a prior art electronic image reject system.
Figure 2:
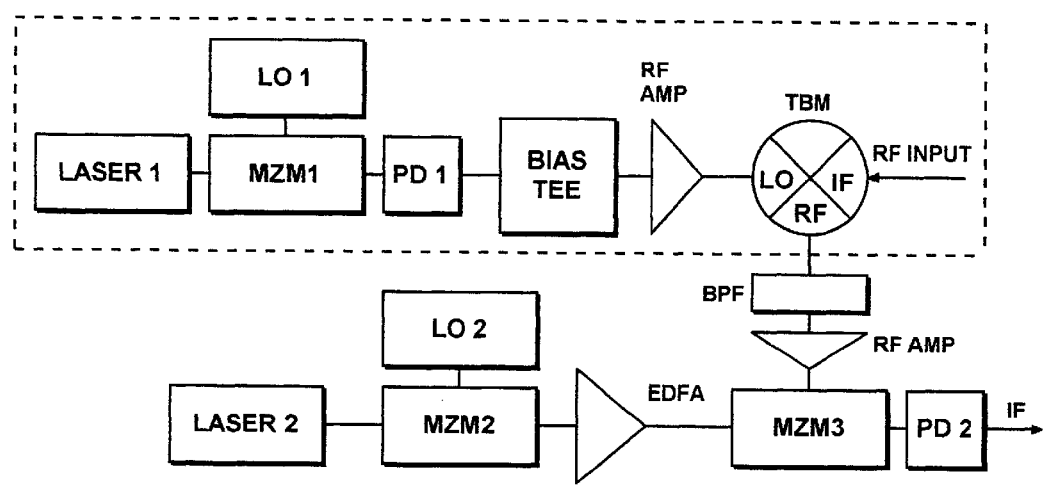
FIG. 2 shows a schematic diagram of a prior art hybrid optical fiber/electronic image rejection down-converter.
Figure 3:
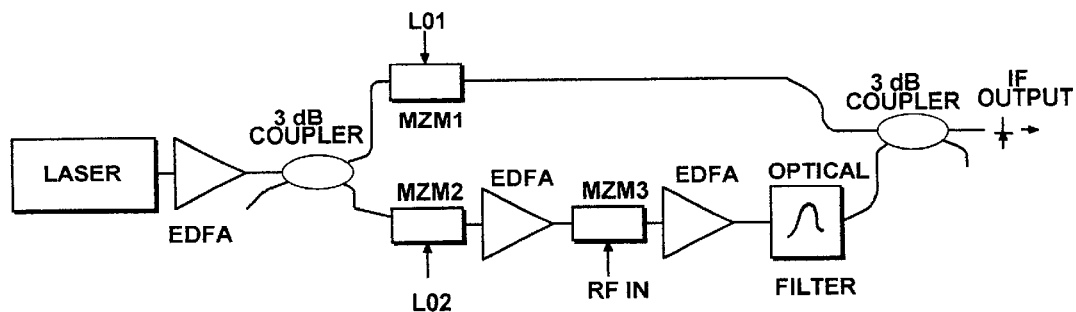
FIG. 3 shows a schematic diagram of a prior art all-optical image reject down-converter.
Figure 8:
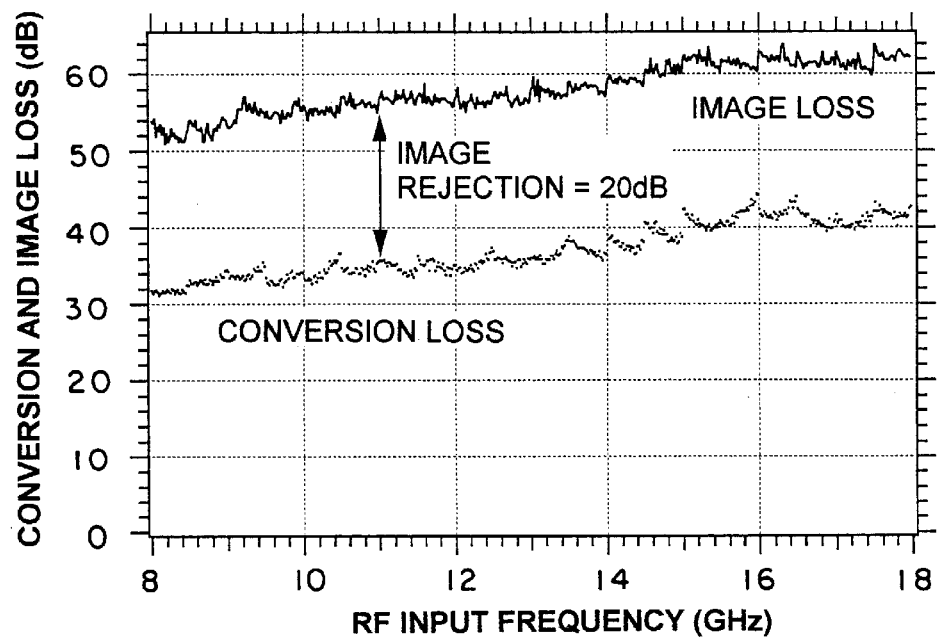
FIG. 8 shows a plot of conversion loss versus image signal powers with a RF input power of +20 dBm.

Narrow-band optical filter 36 allows selection of a particular sideband for implementing the heterodyne down-conversion, resulting in the rejection of unwanted image frequencies present at RF In 32. For example, as shown in FIG. 5d, absent filter 36, an RF input 42 of 5 GHz mixing with 7 GHz sideband 26 would generate an undesirable duplicate 2 GHz signal 44 by forming an additional image at the system output. The image rejection capability of the system is accordingly a function of filter 36 extinction. As shown in FIG. 8, improved down-converter produces a 30 dB conversion loss (CL), providing a substantial improvement over the CL of the all optical down-convertor shown in FIG. 3 that can run as high as 60 dB. Furthermore, down-convertor 10 in requiring one less modulator and much less optical amplification has significantly decreased cost and complexity compared with prior art devices.

Optical modulators 22 and 30 and those described elsewhere herein are preferably Mach-Zehnder type optical modulators or phase modulators, however, it is well known to those skilled in the art that other types of optical modulators capable of generating optical sidebands may be utilized. Optical amplifier 28 and the other amplifiers described below are preferably Erbium doped fiber amplifiers (EDFA), however, it is recognized by those skilled in the art that other types on amplifiers may be utilized as long as they are capable of maintaining the polarization of light. Amplifier 28 and the other amplifiers described herein are optional and may be omitted depending on the performance required. PM fiber is preferred up to coupler 46, although alternatively single mode fiber and polarization controllers may be used.

Figure 6:
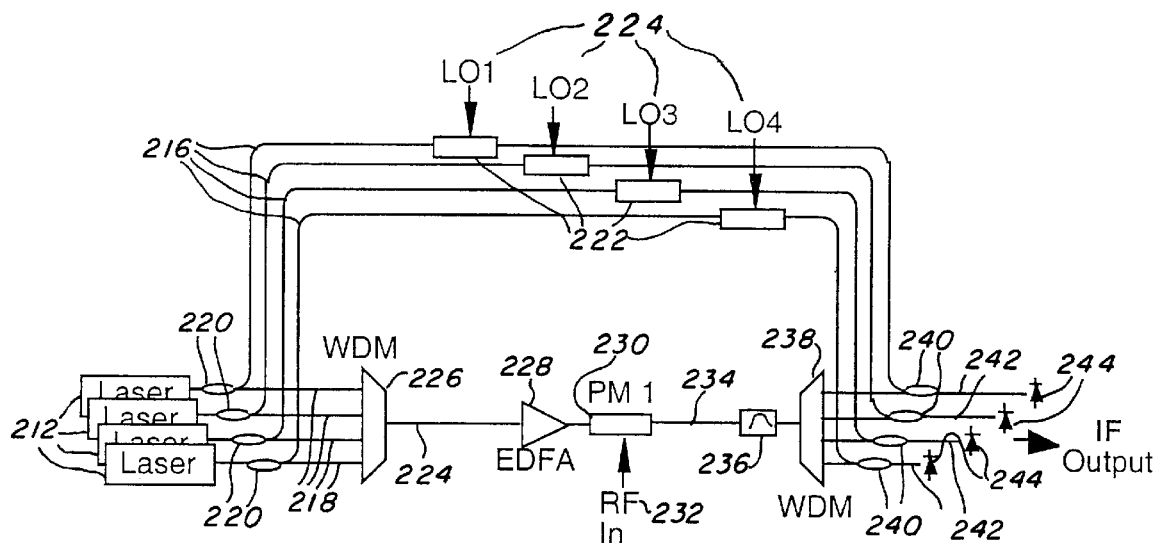
FIG. 6 shows a schematic diagram of a multichannel optical image reject down-converter according to the invention.

A significant advantage of the down-converter of the invention is its capability for building up many channels. Referring now to FIG. 6, a multi-channelizer down-converter 200 includes a plurality of laser light sources 212, each source 212 emitting a light signal 214 divided into a first path 216 and a second path 218 by an optical coupler 220, in the manner as described above for down-converter 10 but involving multiple channels, whereby each light signal 214 is respectively modulated by a phase modulator 222 driven with a local oscillator (LO1–LO4) 224.

In second path 218, each light signal 214 is combined into a single fiber light signal 224 by a first WDM multiplexer 226 or other suitable device. Light signal 224 is then amplified by an amplifier 228 and phase modulated by a single (i.e., non-cascaded) modulator 230 driven with an RF signal 232, generating a light signal 234 at the frequencies of the received signals. Light signal 234 is next passed through a single optical filter 236 positioned before a second WDM 238, or optionally first through WDM 238 and then through multiple optical filters 236 (not shown), to select the desired RF sidebands of each individual laser wavelength. The laser wavelengths are each then recombined via couplers 240 in the manner described above with each beat signal 242 thereby generated by a photodetector 244 exhibiting the desired down-conversion of each received RF signal 232. Again, the optical filter or filters 236 provide the image rejection. Path 218 is shared by each laser wavelength, allowing simultaneous down-conversion of the entire received bandwidth. Down-converter 200 advantageously utilizes WDM technology and enables many of the optical components to be utilized by every channel, decreasing the overall cost and providing a compact design.

Figure 7:
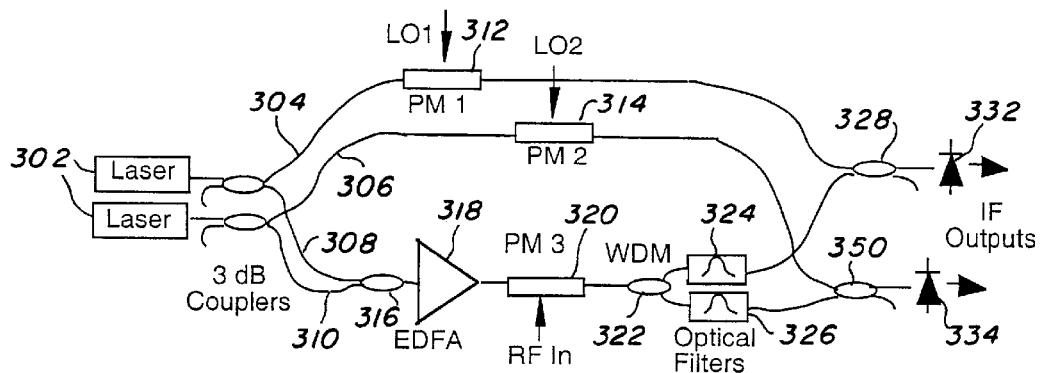
FIG. 7 shows a schematic diagram of a two channel optical image reject down-converter according to the invention.
Figure 9:
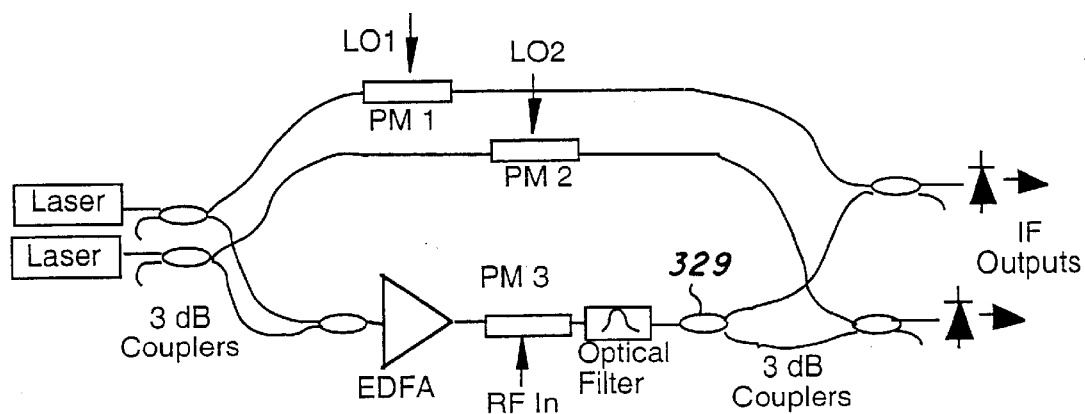
FIG. 9 shows a schematic diagram of a down-converter as in FIG. 8 in which the WDMs are replaced with PM couplers.

A down-converter 300 as shown in FIG. 7 was built and tested. Light at a frequency of 1550 nm from a pair of fiber coupled lasers 302 was respectively divided into first paths 304 and 306 and into second paths 308 and 310 by a pair of 3 dB polarization maintaining couplers 312. In paths 304 and 306, phase modulators 312 and 314 respectively driven by LO1 and LO2 at 6–16 Ghz produced light shifted from the fundamental beam into the RF sidebands. In paths 308 and 310, the light was combined via 50/50 coupler 316, amplified by amplifier 318, and then phase modulated by modulator 320 at the received RF In frequencies of 8–18 Ghz. The individual wavelengths were separated by a WDM 322 and the RF sidebands selected with optical filters 324 and 326 (3 dB bandwidth=0.6 Ghz). The selected sidebands were then respectively recombined with the light from paths 304 and 306 in couplers 328 and 330 and the beat signal between the sidebands was generated and detected by photodiodes 332 and 334. Each channel enabled 0.5 Ghz of received bandwidth to be down-converted. This bandwidth may be increased with the use of wider bandwidth optical filters. The frequencies of LO1 and LO2 combined with the wavelength centers of the optical filters provided the desired 2–2.5 Ghz IF output frequency band. The RF power of LO1 and LO2 were fixed at 1 watt. As shown in FIG. 9, the WDM may be replaced with a 3 dB coupler 329, and the lasers are tuned to wavelengths passed by the optical filter.

Down-converter 300 is ideal for remote applications since it is composed of fiber optic links. It can be used to down-convert microwave signals from low frequencies (<2 Ghz) to as high as 50 Ghz given current technology, and its capability should extend to and exceed 100 Ghz based on projected future technology.

The invention described herein is an improved all optical image rejection system, providing more than 20 dB of image rejection while maintaining less than about 30 dB of conversion loss. Ultrawideband microwave frequency bands may be mapped into narrow frequency bands to simplify processing and the large image rejection capability of this invention allows the precise determination of frequency for direction finding applications. The invention allows provides a method of shifting frequency for radar applications.

Although the invention has been described in relation to an exemplary embodiment thereof, it will be understood by those skilled in the art that still other variations and modifications can be affected in the preferred embodiment without detracting from the scope of the invention as described in the claims.

What is claimed is:

1. An all-optical image reject down-converter, comprising:
   an optical light signal from an optical light source;
   a first optical path for receiving said optical light signal;
   a first optical modulator positioned in said first optical path for receiving and transferring said optical light signal into a first path optical sideband output signal;
   a second optical path for receiving said optical light signal;
   a second, non-cascaded optical modulator positioned in said second optical path for receiving and transferring said optical light signal into a second predetermined sideband frequency to produce an optical signal containing many optical wavelengths;
   a narrow, tunable optical filter for receiving said optical signal containing many optical wavelengths and for generating a filtered second path optical output signal that substantially includes only a desired sideband frequency;
   a coupler for combining the first path output signal with the second path optical output signal to produce a combined signal; and
   a photodetector for receiving said combined signal and for generating a down-converted intermediate frequency optical signal in which unwanted image signals and sidebands are substantially rejected;
   whereby said down-converted intermediate optical signal is transmittable over an optical fiber circuit to remotely located user electronics.

2. A down-converter as in claim 1, wherein the optical light source is any light source useful for down-converting radio frequency frequencies by optical heterodyning.

3. A down-converter as in claim 1, wherein the optical light source is a fiber coupled laser.

4. A down-converter as in claim 3, wherein the laser is of any wavelength.

5. A down-converter as in claim 1, wherein the laser has sufficient power so as not to necessitate subsequent amplification of optical signals transiting the first and second paths within the down-converter.

6. A down-converter as in claim 1, further comprising an optical coupler for dividing the optical light from the optical light source into two paths.

7. A down-converter as in claim 1, wherein the first and second optical modulators are each capable of generating optical sidebands.

8. A down-converter as in claim 1, wherein the first and second optical modulators are Mach-Zehnder optical modulators.

9. A down-converter as in claim 1, wherein the first and second optical modulators are phase modulators.

10. A down-converter as in claim 1, further comprising an optical amplifier.

11. A down-converter as in claim 10, wherein the optical amplifier is an Erbium doped fiber amplifier.

12. A down-converter as in claim 10, wherein the amplifier is capable of maintaining polarization of light.

13. A down-converter as in claim 1, wherein the optical filter has a bandwidth and extinction meeting designer requirements.

14. An all-optical image reject down-converter, comprising:
- a plurality of optical light sources, each of said plurality of optical light sources generating an optical light signal;
- a first optical path associated with each said optical light signal;
- an optical modulator associated with each said optical light signal of said first optical path for receiving and transferring each said first path optical light signal into a first path optical sideband output signal;
- a second optical path associated with each said optical light signal;
- a first multiplexer for receiving and combining said each said optical light signal into a single light signal;
- a second path optical modulator for receiving and modulating said single light signal at a frequency of a received RF signal to produce a light signal containing many optical wavelengths;
- a narrow, tunable optical filter for receiving said light signal containing many optical wavelengths and for filtering out substantially all signals to produce a light signal having desired sideband frequencies;
- a second multiplexer for dividing said light signal into a plurality of separate light signals, each of said plurality of separate light signals including a desired sideband frequency;
- a plurality of couplers, wherein each said coupler of said plurality of couplers combines one of said first path optical signals with one of said plurality of separate light signals to produce a combined optical signal; and
- a plurality of photodetectors, wherein each said photodetector of said plurality of photodetectors receives one of said combined optical signals and generates a down-converted intermediate frequency optical signal without unwanted image signals and an unwanted sideband;
- whereby each said down-converted intermediate frequency optical signal is transmittable over an optical fiber circuit to remotely located user electronics.

15. A down-converter as in claim 14, wherein each of the optical light sources is any light source useful for down-converting radio frequency frequencies by optical heterodyning.

16. A down-converter as in claim 14, wherein each of the optical light sources is a fiber coupled laser.

17. A down-converter as in claim 16, wherein each of the lasers is of any wavelength.

18. A down-converter as in claim 14, wherein each of the lasers has sufficient power so as not to necessitate subsequent amplification of optical signals transiting the first and second paths within the down-converter.

19. A down-converter as in claim 14, further comprising a plurality of optical couplers for dividing the optical light from each respective optical light source into two paths.

20. A down-converter as in claim 14, wherein the optical modulators are any type capable of generating optical sidebands.

21. A down-converter as in claim 14, wherein the optical modulators are Mach-Zehnder optical modulators.

22. A down-converter as in claim 14, wherein the optical modulators are phase modulators.

23. A down-converter as in claim 14, further comprising an optical amplifier.

24. A down-converter as in claim 23, wherein the optical amplifier is an Erbium doped fiber amplifier.

25. A down-converter as in claim 23, wherein the amplifier is capable of maintaining polarization of light.

26. A down-converter as in claim 14, wherein the optical filter is any type with a bandwidth and extinction meeting designer requirements.

27. An all-optical image reject down-converter for converting a received radio frequency signal into a signal, comprising:
- an optical light source for generating an optical light;
- a polarization-maintaining optical coupler for dividing the optical light from the light source into a first optical signal for traversing a first optical light path, and a second optical signal for traversing a second optical light path, wherein said first optical light path comprises a first optical modulator for modulating the optical light in the first path with a local oscillator signal to produce a modulated first optical signal, and wherein said second optical light path comprises (i) an optical amplifier having an input side for receiving and amplifying the second optical signal, (ii) a second, non-cascaded optical modulator for receiving the second optical signal and for converting the second optical signal into optical sidebands, and (iii) a tunable narrow bandwidth optical filter for receiving the optical sidebands and for substantially passing only a desired, filtered optical sideband signal;
- a coupler for combining the filtered optical sideband signal with the modulated first optical signal;
- a photodetector for receiving said combined signal and for generating a down-converted signal; and
- an optical transmission line for transmitting the down-converted optical signal to remote user electronics.

28. A method for mapping of received radio frequency signals into arbitrary intermediate frequency range optical signals precluding interference between the receive signals, comprising the steps of
- generating an optical light;
- dividing said optical light into a first path and a second path;
- transferring the optical light in said first path into an optical sideband by modulating it with a first local oscillator frequency;
- converting the light in the second path into predetermined frequency sidebands by modulating it with a second local oscillator frequency, said second path modulation being performed without cascading;
- amplifying and generating additional sidebands by a predetermined electrical frequency;
- passing the amplified optical light in the second light path through a narrow-band tunable optical filter to removed all optical frequencies present except a predetermined optical sideband frequency thereby producing a filtered optical light signal;
- heterodyning the filtered optical light signal with the modulated optical signal from the first path to produce a combined signal; and
- receiving said combined signal and generating a down-converted optical signal usable by an electronic circuit.

* * * * *